United States Patent

Leavitt et al.

[11] Patent Number: 6,114,705
[45] Date of Patent: Sep. 5, 2000

[54] SYSTEM FOR CORRECTING ECCENTRICITY AND ROTATIONAL ERROR OF A WORKPIECE

[75] Inventors: William Leavitt, Haverhill; David Holbrook, Lexington, both of Mass.

[73] Assignee: Varian Semiconductor Equipment Associates, Inc., Gloucester, Mass.

[21] Appl. No.: 08/927,503

[22] Filed: Sep. 10, 1997

[51] Int. Cl.[7] ............................. G21K 5/10; H01J 39/30
[52] U.S. Cl. ................................. 250/442.11; 250/492.21
[58] Field of Search ......................... 250/440.11, 442.11, 250/492.21, 398

[56] References Cited

U.S. PATENT DOCUMENTS

| | | | |
|---|---|---|---|
| 4,345,836 | 8/1982 | Phillips | 355/53 |
| 4,530,635 | 7/1985 | Engelbrecht et al. | 414/627 |
| 4,558,984 | 12/1985 | Garrett | 414/609 |
| 4,695,215 | 9/1987 | Jacoby et al. | 414/225 |
| 4,707,647 | 11/1987 | Coldren et al. | 318/568 |
| 4,745,287 | 5/1988 | Turner | 250/442.11 |
| 5,034,618 | 7/1991 | Akeel et al. | 250/561 |
| 5,238,354 | 8/1993 | Volovich | 414/779 |
| 5,452,521 | 9/1995 | Niewmierzycki | 33/520 |
| 5,479,108 | 12/1995 | Cheng | 324/765 |
| 5,511,934 | 4/1996 | Bacchi et al. | 414/783 |

*Primary Examiner*—Bruce C. Anderson
*Attorney, Agent, or Firm*—Wolf, Greenfield & Sacks, P.C.

[57] ABSTRACT

A system for correcting eccentricity and rotational error of a substantially circular workpiece, in which the workpiece is moved to a workstation, using a translating device. The rotational position and position of the workpiece center is determined. There is a rotatable member at the workstation, having a home position and a center. The rotatable member is pre-rotated from its home position an amount sufficient to correct workpiece rotational error. The translating device is caused to place the workpiece on the rotatable member such that the workpiece center is at a known position relative to the center of the rotatable member, to correct eccentricity. The rotatable member is then rotated back to its home position, to correct rotational error.

15 Claims, 2 Drawing Sheets

SYSTEM FOR CORRECTING ECCENTRICITY AND ROTATIONAL ERROR OF A WORKPIECE

FIELD OF THE INVENTION

This invention relates to a system for correcting eccentricity and rotational error of a substantially circular workpiece such as a semiconductor wafer.

BACKGROUND OF THE INVENTION

In integrated circuit production facilities, integrated circuits are fabricated with a process step which deposits impurity ions into the silicon surface by irradiating the silicon wafer with a beam of accelerated dopant ions. To perform this process step correctly, the crystalline lattice of the silicone wafer must be angularly aligned with the ion beam in two orthogonal degrees of freedom. During implant, the wafer is placed on a flat pad (the implant pad). Often, several implant pads are mounted on a large spinning disk so that several wafers may be processed in parallel. The disk can be tilted with respect to the ion beam to control one angular degree of freedom (tilt). To control the second angular degree of freedom (twist) a sensor is used to measure the rotational position of a reference notch (or flat) on the wafer and then a rotational actuator rotates the wafer so that it will be placed on the pad in the correct twist relationship to the ion beam. The process of measuring and actuating for the correct wafer twist is commonly referred to as wafer orientation.

Conventional ion implanters incorporate several mechanical actuators and sensing systems to accomplish the orient operation. In a conventional implanter, an un-oriented wafer is robotically moved to and placed on an orienting pedestal. The pedestal then rotates to enable a sensor to determine the distance from the center of rotation to the perimeter of the wafer. Since the twist reference notch (or flat) on the wafer causes the measured perimeter to decrease, the rotational position where the perimeter is a minimum represents the rotational position of the notch (or flat). This description assumes that the wafer is centered on the pedestal when the orientation is measured. In reality, it is not. An x/y centration error is commonly referred to as an eccentricity error. The data set describes both the centration (eccentricity) and the rotational position of the notch (twist). In a conventional implanter, this data set is analyzed with computer algorithms to determine the wafer rotation and centration on the pedestal.

In a conventional implanter, following the measurement of the wafer centroid and rotation al position, the wafer is rotated to correct the measured rotational error. The wafer is then picked up by a robot and received by a pedestal (wafer lifter) which lowers the wafer to the correct X,Y and rotational position on the implant pad. To accomplish the wafer handling and orientation operation in a conventional implanter system, the wafer is commonly handled by at least four robotic actuators, including:

1) a wafer shuttle which moves the wafer from the loadlock (containing a cassette full of wafers to be processed) to the orient pedestal.
2) an orient pedestal which rotates the wafer so the X,Y and rotational positions can be measured. After establishing these positions, the orient pedestal rotates the wafer to the correct rotational position.
3) an orient to pad robot which moves the wafer from the orient pedestal to a position above the implant pad.
4) a wafer lifter which lowers (raises) the wafer from (to) the robot to (from) the implant pad.

SUMMARY OF THE INVENTION

It is therefore an object of this invention to provide a system for correcting eccentricity and rotational error of a substantially circular workpiece.

It is a further object of this invention to provide such a system which is faster than other systems for correcting eccentricity and rotational error.

It is a further object of this invention to provide such a system which increases wafer throughput in wafer processing systems.

It is a further object of this invention to provide such a system which is more compact than other such systems.

It is a further object of this invention to provide such a system which is less expensive than other such systems.

It is a further object of this invention to provide such a system which results in less wafer contamination than other such systems.

It is a further object of this invention to provide such a system which is less likely to result in positional error as compared to other such systems.

This invention features a system for correcting eccentricity and rotational error of a substantially circular workpiece, in which the workpiece is moved to a workstation using a translating device, the system comprising: means for determining the rotational position and position of the workpiece center; a rotatable member at the workstation, having a home position and a center; means, responsive to the means for determining, for pre-rotating the rotatable member from its home position an amount sufficient to correct workpiece rotational error; means, responsive to the means for determining, for causing the translating device to place the workpiece on the rotatable member such that the workpiece center is at a known position relative to the center of the rotatable member, to correct eccentricity; and means for rotating the rotatable member back to its home position, to correct rotational error.

The means for determining the rotational position and position of the workpiece center may include a machine vision system which captures an image of the workpiece, and computes the rotational position and position of the workpiece center therefrom. The rotatable member may include a multiple fingered pedestal. The fingers of the pedestal may be equally spaced about the center of the pedestal, and project radially therefrom. The workstation may include a workpiece-receiving pad with a plurality of radial slots for receiving the fingers of the pedestal, to allow the pedestal to be withdrawn below the surface of the workpiece-receiving pad. The pedestal may include three fingers.

The system may further include means for lifting the rotatable member above the pad surface before it is prerotated, and for withdrawing the rotatable member below the pad surface after the rotatable member is rotated back to its home position. The machine vision system may include an image capture means on one side of the workpiece, and a light source on the other side of the workpiece, to better define the workpiece periphery.

The means for determining the rotational position and position of the workpiece center may include means for measuring the position of the workpiece center relative to the translating device, when the workpiece is on the translating device. The means for causing the translating device to place the workpiece may include means for moving the translating device over the workstation such that the workpiece center is over the workstation center. The means for measuring the position of the workpiece may include means for capturing an image of the workpiece.

This invention features in a more specific embodiment a system for correcting eccentricity and rotational error of a substantially circular wafer, in which the wafer is moved to a pad using a translating device with an end effector, the system comprising: means for determining the rotational position and position of the workpiece center, the means including a machine vision system which captures an image of the workpiece while it is on the end effector, and computes the rotational position and position of the workpiece center therefrom; a multiple-fingered pedestal rotatable member at the workstation, having a home position and a center; means for lifting the rotatable member above the pad surface before it is prerotated, and for withdrawing the rotatable member below the pad surface after the rotatable member is rotated back to its home position; means, responsive to the means for determining, for pre-rotating the rotatable member from its home position an amount sufficient to correct workpiece rotational error; means, responsive to the means for determining, for causing the translating device to place the workpiece on the rotatable member such that the workpiece center is at the center of the rotatable member, to correct eccentricity; and means for rotating the rotatable member back to its home position, to correct rotational error.

The pedestal in this more specific embodiment may include three fingers equally spaced about the center of the pedestal, and projecting radially therefrom, and the pad may have a plurality of radial slots for receiving the fingers of the pedestal, to allow the pedestal to be withdrawn below the surface of the workpiece-receiving pad. The machine vision system in this embodiment may include an image capture means on one side of the workpiece, and a light source on the other side of the workpiece, or on the same side of the workpiece, to better define the workpiece periphery.

BRIEF DESCRIPTION OF THE DRAWINGS

Other objects, features and advantages will occur to those skilled in the art from the following description of the preferred embodiment, and the accompanying drawings, in which.

DETAILED DESCRIPTION OF THE PREFERRED EMBODIMENT

This invention may be accomplished in a system for correcting eccentricity and rotational error of a substantially circular workpiece which is moved to a work station using a translating device. The invention is applicable to semiconductor wafer processes such as ion implantation, stereolithography, chemical vapor deposition, and any other wafer processing application in which the rotational position and position of the wafer center must be known.

Figure 1:
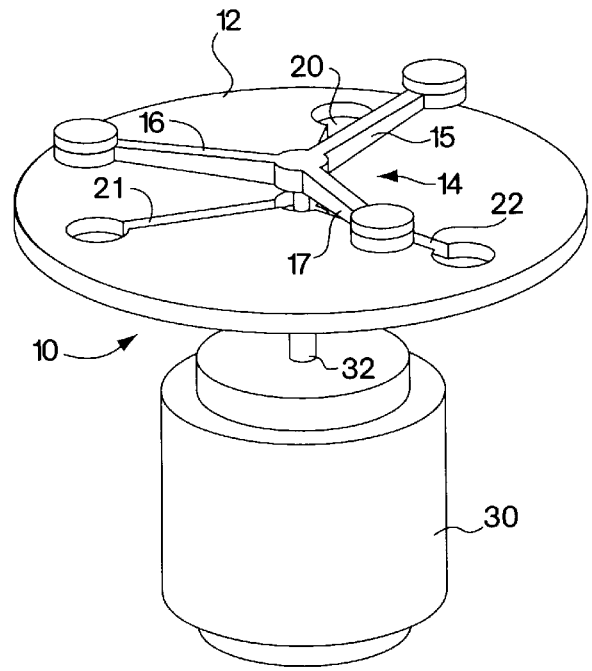
FIG. 1 is a perspective view of a preferred embodiment of the orient pedestal mechanism for the system of this invention.

A preferred embodiment of an orient pedestal mechanism for the system of this invention is shown in FIG. 1. Mechanism 10 includes motor 30 with output shaft 32 having at its distal end rotatable member 14 which in this embodiment comprises a three-fingered pedestal with identical fingers 15–17 equally spaced around the center of the pedestal. Motor 30 is adapted to rotate member 14 about its center, and also translate it up and down, towards and away from motor 30. The translational motion is sufficient to lift rotatable member 14 above implant pad 12, as well as to withdraw member 14 below the surface of the pad 12 (and preferably all the way through pad 12). Radial slots 20–22 are formed through the thickness of pad 12 about its center, equally spaced and extending radially therefrom. Each of slots 20–22 is slightly longer and wider than pedestal fingers 15–17 to allow pedestal 14 to be moved into and out of implant pad 12. Because of the 120° spacing of the fingers and slots, motion of no more than 60° is needed to align member 14 with the slots.

As explained in more detail below in conjunction with FIG. 3, the system of this invention includes means for determining the rotational position and position of the center of the workpiece before it is placed on pad 12. Rotational error of the workpiece is corrected using the orient pedestal mechanism 10 of FIG. 1. The desired rotational correction of the workpiece is calculated. Orient pedestal 14 is then lifted through and above pad 12, and rotated an amount sufficient to correct the rotational error. Once the workpiece is placed on pedestal 14, it is rotated back to its home position in which fingers 15–17 are aligned with slots 20–22. Mechanism 14 is then lowered and withdrawn below the surface of pad 12, to deposit the workpiece on the surface of pad 12, with a corrected rotational position relative to pad 12.

Member 14 can take other shapes as well, for example an irregular pedestal, or a small turntable. In ion implantation, the implant pad is also a heat sink. In order to prevent heat imbalances in a wafer being implanted, it is important not to have an opening (or area of no contact with the wafer) in the implant pad along the ion beam scan direction, greater than about ¾". Thus, a ¾" turntable, or more than one such turntable, could be used. The shape of the member 14 is not a limitation of this invention.

Figure 2:
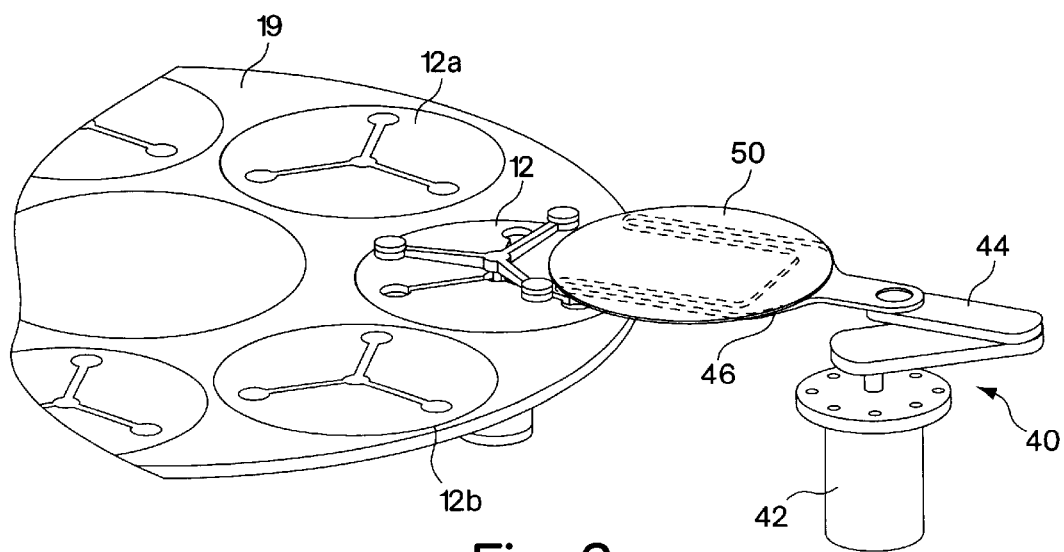
FIG. 2 is a perspective view of a translating device for this invention ready to hand off a workpiece to the orient pedestal mechanism of FIG. 1.

FIG. 2 illustrates a circular silicon wafer workpiece 50 being moved to implant pad work station 12 with translating device 40. Device 40 is a standard wafer translational robot arm which includes motor 42 which drives arm 40 with end effector 46 at the distal end thereof. End effector 46 is typically a fork-shaped mechanism which defines an opening which is wider than the diameter of the circle defined by the orient pedestal 14, FIG. 1, so that end effector 46 can be used to place wafer 50 on mechanism 14, and then withdraw from wafer 50 once wafer 50 is resting on orient mechanism 14. Also illustrated in FIG. 2 is implant disk 19 which carries a number of implant pads such as pads 12, 12a, and 12b, around its periphery. Because the system of this invention speeds the loading and unloading of wafers onto and off of the implant pads, the throughput of a wafer processing system using the invention is increased, thereby decreasing the costs associated with implantation or the other processing of the workpiece accomplished using the system of this invention.

Figure 3:
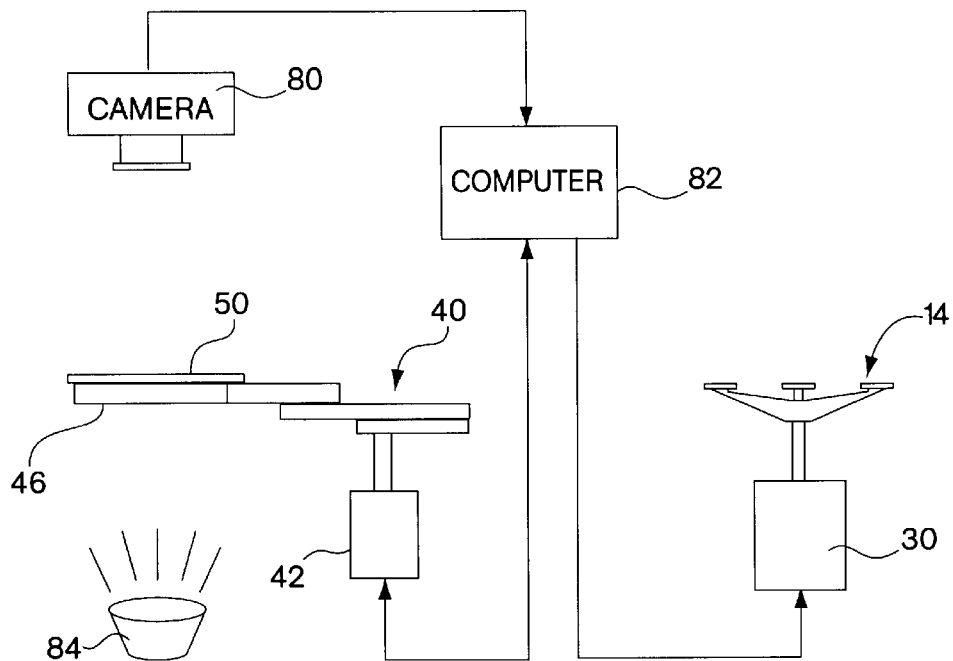
FIG. 3 is a schematic diagram of the preferred machine vision system of the system of this invention.

The preferred manner in which the rotational position and position of the workpiece center is determined, and the workpiece translating device controlled to place the workpiece properly on the rotatable workpiece-receiving member, are shown in FIG. 3. The means for determining the rotational position and position of the workpiece center is preferably accomplished with a machine vision system which captures an image of workpiece 50 while it is being carried by end effector 46 of translating device 40. The image is captured with video camera 80. Back light 84, which is on the opposite side of workpiece 50 from camera 80, is preferably used to better define the periphery of workpiece 50. However, the light could be on the same side of the workpiece as the camera. The image from camera 80 is provided to computer 82, which determines in a known manner the center of workpiece 50, as well as its rotational position. Since the position of end effector 46 is known at the time the image is captured (because the robot inherently knows its position, or due to fiducial marks on the end effector, as are known in the art), such image processing determines the rotational and center wafer position relative to any fixed point in the wafer processing system employing the system of this invention. In the preferred embodiment shown, the measured rotational and center position may thus be equated to the position of the wafer orient mechanism, and thus to the implant pad.

A machine vision system which is capable of capturing a video image of the wafer and computing the rotational position and center of a wafer as the wafer is moved from the load lock to the implant pad is the IC-PCI/MVC by Imaging Technology. This system can calculate the rotational and centroid position of the wafer in less than one-half second. The determined centroid position is used to cause translating device 40 to place wafer 50 on rotatable member 14 such that the center of wafer 50 is at a known position relative to the center of rotatable member 14 (typically at its center). This corrects eccentricity of wafer 50.

Wafer twist errors are corrected using the rotational position information determined by computer 82. To place the wafer at any angle on an implant pad, both the desired twist angle and the measured rotational position must be known. The desired twist angle is specified by the user and may be resident in computer 82. The actual twist angle can be measured by any method, and preferably the machine vision method detailed above. With this information, a signal is provided from computer 82 to motor 30 to pre-rotate orient mechanism 14 a predetermined number of degrees from its home position. This allows pedestal 14 to receive the wafer, rotate back to its home position, and drop down and through the surface of the implant pad, leaving the wafer at the correct angular position on the pad. Because the wafer translating mechanism has also been enabled to center the wafer on the orient mechanism, this process results in the proper angular and positional location of wafer 50 on the implant pad.

Figure 4:
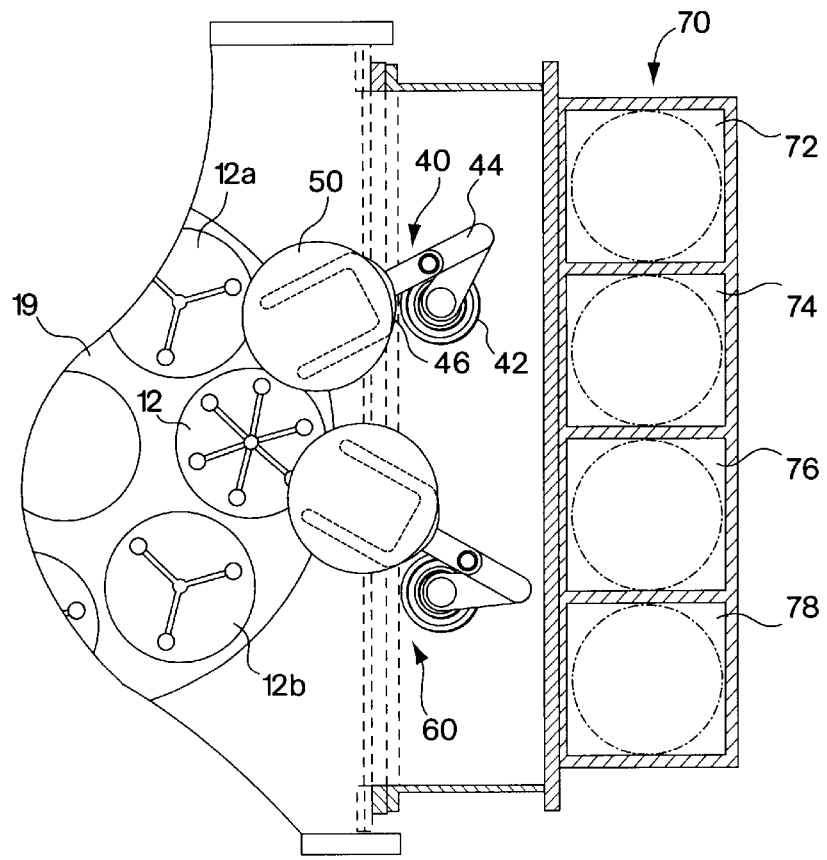
FIG. 4 is a plan view of a workpiece handling system for the invention.

FIG. 4 shows an embodiment of an implant system with translational device 40 which withdraws wafers from cassettes 72 and 74 and places them on the implant pads. A second translational device 60 moves the processed wafers from the implant pads back to empty cassettes 76 and 78. It would be possible to use a single translational device to both load and unload all of the cassettes, or other loading/unloading schemes. This invention can determine the rotational position and centroid position of a workpiece while it is moving from a cassette to the implant pad. The system of this invention can thus be accomplished without the need for a separate orient pedestal. Camera 80 can be located anywhere between the wafer load/unload station 70 and implant disk 19, such as shown at location 80. Thus, there is no extra space required for a separate wafer orient mechanism, as is the case in prior systems. Also, the system of this invention performs wafer orientation and placement on the implant disk in a single step of movement of the wafer from the cassette to the implant disk. Thus, the time required for wafer hand-off to an orient pedestal, and for wafer pickup from the orient pedestal, is eliminated. Elimination of these two wafer handling operations thus reduces handling cycle time, as well as the amount of robotic hardware required to correctly place wafers on the implant pad.

An additional advantage of this invention is that each time a wafer is handled, there is the possibility of particulate contamination being deposited on the wafer surface, which can ruin a wafer. Since there are two less handling steps accomplished in the system of this invention as opposed to prior art systems with a separate wafer orientation station, the chance of contamination is greatly reduced.

Yet another advantage the system of this invention is that there is no chance of cumulative positional errors due to repeated wafer handling, because the wafer does not leave the end effector between the time it is measured and the time it is placed on the implant pad. Also, the machine vision system (or a second camera for one system) could be placed at the implant pad itself, which would completely eliminate any error introduced by the translating robot arm. Alternatively, a second machine vision system could be employed at the implant pad to re-check the wafer position to insure that no error has been introduced between the position at which the wafer position is measured, and the implant pad.

Although specific features of this invention are shown in some drawings and not others, this is for convenience only as each feature may be combined with any or all of the other features in accordance with the invention.

Other embodiments will occur to those skilled in the art and are within the following claims:

What is claimed is:

1. A system for correcting eccentricity and rotational error of a substantially circular workpiece, in which the workpiece is moved to a workstation using a translating device, the system comprising:

means for determining the rotational position and position of the workpiece center;

a rotatable member at the workstation, having a home position and a center;

means, responsive to said means for determining, for pre-rotating said rotatable member from its home position an amount sufficient to correct workpiece rotational error;

means, responsive to said means for determining, for causing the translating device to place the workpiece on said rotatable member such that the workpiece center is at a known position relative to the center of said rotatable member, to correct eccentricity; and means for rotating said rotatable member back to its home position, to correct rotational error, wherein the eccentricity and rotational error of the workpiece are corrected without transferring the workpiece to an alignment station.

2. The system of claim 1 in which said means for determining the rotational position and position of the workpiece center includes a machine vision system which captures an image of the workpiece, and computes said rotational position and position of the workpiece center therefrom.

3. The system of claim 2 in which said machine vision system includes an image capture means on one side of the workpiece, and a light source on the other side of the workpiece, to better define the workpiece periphery.

4. The system of claim 2 in which said machine vision system includes an image capture means and a light source, both on the same side of the workpiece, in which said image capture means captures light from said light source reflected from said workpiece.

5. The system of claim 1 in which said rotatable member includes a multiple fingered pedestal.

6. The system of claim 5 in which said fingers of said pedestal are equally spaced about the center of said pedestal, and project radially therefrom.

7. The system of claim 6 in which the workstation includes a workpiece-receiving pad with a plurality of radial slots for receiving said fingers of said pedestal, to allow said pedestal to be withdrawn below the surface of said workpiece-receiving pad.

8. The system of claim 7 further including means for lifting said rotatable member above the pad surface before it is prerotated, and for withdrawing said rotatable member below the pad surface after said rotatable member is rotated back to its home position.

9. The system of claim 6 in which said pedestal includes three fingers.

10. The system of claim 1 in which said means for determining the rotational position and position of the workpiece center includes means for measuring the position of said workpiece center relative to the translating device, when said workpiece is on said translating device.

11. The system of claim 10 wherein the workstation has a center, and in which said means for causing the translating device to place the workpiece includes means for moving said translating device over the workstation such that said workpiece center is over said workstation center.

12. The system of claim 10 in which said means for measuring the position of said workpiece includes means for capturing an image of the workpiece.

13. A system for correcting eccentricity and rotational error of a substantially circular workpiece, in which the workpiece is moved to a pad using a translating device with an end effector, the system comprising:

means for determining the rotational position and position of the workpiece center, said means including a machine vision system which captures an image of the workpiece while it is on the end effector, and computes the rotational position and position of the workpiece center therefrom;

a multiple-fingered pedestal rotatable member at the workstation, having a home position and a center;

means for lifting said rotatable member above the pad surface before it is pre-rotated, and for withdrawing said rotatable member below the pad surface after said rotatable member is rotated back to its home position;

means, responsive to said means for determining, for pre-rotating said rotatable member from its home position an amount sufficient to correct workpiece rotational error;

means, responsive to said means for determining, for causing the translating device to place the workpiece on said rotatable member such that the workpiece center is at the center of said rotatable member, to correct eccentricity; and means for rotating said rotatable member back to its home position, to correct rotational error, wherein the eccentricity and rotational error of the workpiece are corrected without transferring the workpiece to an alignment station.

14. The system of claim 13 in which said pedestal includes three fingers equally spaced about the center of said pedestal, and projecting radially therefrom, and in which said pad has a plurality of radial slots for receiving said fingers of said pedestal, to allow said pedestal to be withdrawn below the surface of said workpiece-receiving pad.

15. The system of claim 13 in which said machine vision system includes an image capture means on one side of the workpiece, and a light source on the other side of the workpiece, to better define the workpiece periphery.

* * * * *